United States Patent
De Doncker et al.

(10) Patent No.: US 7,541,814 B2
(45) Date of Patent: Jun. 2, 2009

(54) METHOD AND DEVICE FOR DETERMINING THE CHARGE OF A BATTERY

(75) Inventors: Rik W. De Doncker, Leuven (BE); Abderrezak Hammouche, Aachen (DE); Eckhard Karden, Aachen (DE); Birger Fricke, Aachen (DE)

(73) Assignee: Rheinische Landschaftspflege Jakob Voets INg. Grad. GmbH & Co. KG, Erkelenz (DE)

( * ) Notice: Subject to any disclaimer, the term of this patent is extended or adjusted under 35 U.S.C. 154(b) by 101 days.

(21) Appl. No.: 10/573,510

(22) PCT Filed: Sep. 24, 2004

(86) PCT No.: PCT/EP2004/010783

§ 371 (c)(1),
(2), (4) Date: Jan. 8, 2007

(87) PCT Pub. No.: WO2005/031380

PCT Pub. Date: Apr. 7, 2005

(65) Prior Publication Data

US 2007/0090843 A1   Apr. 26, 2007

(30) Foreign Application Priority Data

Sep. 26, 2003  (DE) .................... 103 45 057

(51) Int. Cl.
*G01N 27/416* (2006.01)
(52) U.S. Cl. ................. 324/426; 324/427; 324/430
(58) Field of Classification Search .............. 320/130, 320/132, 134, 136; 324/426, 427, 430, 434, 324/436
See application file for complete search history.

(56) References Cited

U.S. PATENT DOCUMENTS

| | | | | |
|---|---|---|---|---|
| 3,984,762 A | * | 10/1976 | Dowgiallo, Jr. | 324/430 |
| 6,094,033 A | * | 7/2000 | Ding et al. | 320/132 |
| 6,160,382 A | | 12/2000 | Yoon et al. | |
| 6,172,483 B1 | * | 1/2001 | Champlin | 320/134 |
| 6,191,590 B1 | | 2/2001 | Kluetz et al. | 324/428 |
| 6,262,563 B1 | | 7/2001 | Champlin | |

(Continued)

FOREIGN PATENT DOCUMENTS

DE  197 25 204  4/1999

(Continued)

OTHER PUBLICATIONS

International Search Report from PCT/EP2004/010783.

(Continued)

*Primary Examiner*—Akm E Ullah
*Assistant Examiner*—Johali A Torres Ruiz
(74) *Attorney, Agent, or Firm*—Marshall, Gerstein & Borun LLP

(57) ABSTRACT

A method and device for determining the charge of a battery, characterized in that a gain crossover frequency ($f_\pm$) for an impedance of the battery excited by an alternating current signal is established, and the gain crossover frequency ($f_\pm$) is assigned to the charge of the battery, whereby the gain crossover frequency ($f_\pm$) is a frequency of the alternating current signal at which an imaginary portion of the impedance of the battery vanishes.

28 Claims, 7 Drawing Sheets

U.S. PATENT DOCUMENTS 6,519,539 B1 * 2/2003 Freeman et al. ............... 702/65
2002/0196025 A1   12/2002 Freeman et al.
2003/0112010 A1 * 6/2003 Koch ......................... 324/427

FOREIGN PATENT DOCUMENTS

| JP | 2001 235525 A | 8/2001 |
| WO | WO 00/31557 | 6/2000 |
| WO | WO 01/50119 | 7/2001 |
| WO | WO 02/27342 A2 | 4/2004 |

OTHER PUBLICATIONS

"A Review of Impedance Measurements for Determination of the State-of-Charge or State-of-Health of Secondary Batteries", Huet, *Journal of Power Sources*, 70, 1998, pp. 59-69.

International Preliminary Report on Patentability in PCT/EP2004/010783 dated Jun. 12, 2006.

* cited by examiner

METHOD AND DEVICE FOR DETERMINING THE CHARGE OF A BATTERY

TECHNICAL FIELD

The invention relates to a method for determining the state-of-charge of a battery.

Here, the term "battery" is used in the sense of a general electrochemical accumulator, composed of one or many cells, where the electrical energy is produced by chemical reactions.

The procedure and the device according to this invention are suitable for the determination of the state-of-charge of rechargeable lead-acid, nickel-cadmium (Ni—Cd) and nickel-metal hydride (Ni—MH) batteries.

Moreover, the invention relates to a device suited for carrying out the method.

STATE OF THE ART

Common methods for the determination of battery state-of-charge are based on the determination of the concentration of the battery electrolyte by measuring directly certain properties of the electrolyte. Thus, the concentration of an electrolyte can be deduced from, amongst others, its density, pH value or electrical conductivity. However, these methods can be applied only for those battery types in which the electrolyte takes part in the overall reaction, such as lead-acid batteries. These methods are time-consuming, as they require access to the inside of the battery. Finally, they are not precise enough in all conditions since the electrolyte concentration within the battery is not homogenous. A survey on commonly used methods for state-of-charge determination in relation with the different battery applications is published by S. Piller, M. Perrin and A. Jossen: "Methods for state-of-charge determination and their applications", Journal of Power Sources 96 (2001) 113-120.

Other methods are based on electrical measurements, which require contacts to the battery poles. The most precise determination of state-of-charge is deduced from a complete discharge of the battery. This consists in measuring the discharge duration at a discharge current intensity till the battery voltage reaches the cut-off value. The capacity of the battery is calculated from the data of this experiment. Finally, the battery must be recharged before it can be used again. Since the battery has a limited cycle-life, these discharge-charge test cycles contribute to the reduction of the battery life. Also, the procedure cannot be applied if a continuous monitoring of the battery is necessary, particularly when interruption in the battery service is to be avoided.

Further electrical measuring procedures determine the battery internal resistance. This parameter can be measured by examining the voltage drop resulting from a discharge pulse or by evaluating the battery impedance measured at a single frequency.

The variations in the internal resistance basically stem from the change in the electrolyte conductivity. Consequently, these measuring methods show the same limitations as the direct measurement of the electrolyte features. The method cannot be applied for alkaline batteries, as their electrolyte does not participate to the overall battery reaction. There are also limitations for lead-acid batteries. The side reactions occurring during battery charge affect the internal resistance of the battery. Therefore, the relationship between the internal resistance and battery state-of-charge is not monotonous. In addition, the variations of the internal resistance are tiny, which limits the sensitivity of the measuring procedure.

Impedance spectroscopy is a known method for the investigation of electrochemical systems such as rechargeable batteries. With this method, the complex impedance of the battery is measured for several frequencies in the form of a spectrum.

A typical presentation of the measuring data is the so-called Nyquist diagram. In this presentation, the imaginary part of the complex impedance is plotted as a function of the real part of the complex impedance. FIG. 1 displays a typical impedance diagram of a commercial battery. The imaginary axis is usually plotted in the opposite direction, that is, the positive values of Z" below the real axis and negative values above the real axis of Z".

Various parameters, which depend on the battery state-of-charge, can be deduced from the impedance spectrum. F. Huet: ["A review of impedance measurements for determination of the state-of-charge or state-of-health of secondary batteries", Journal of Power Sources 70 (1998) 59-69,] and S. Rodrigues, N. Munichandraiah and A. K. Shukla: ["A review of state-of-charge indication of batteries by means of ac impedance measurements", Journal of Power Sources 87 (2000) 12-20], reviewed the published data on impedance studies of batteries and battery electrodes, undertaken for the purpose of state-of-charge determination. It has been shown that various impedance parameters are useful to estimate the status of battery systems under different experimental conditions, under load as well as at open-circuit after a period of rest.

Earlier measurements conducted on alkaline batteries [Ph. Blanchard: "Electrochemical impedance spectroscopy of small Ni—Cd sealed batteries: application to state-of-charge determinations", Journal of Applied Electrochemistry 22 (1992) 1121-1128] and on lithium-ion batteries [S. Rodrigues, N. Munichandraiah and A. K. Shukla: "AC impedance and state-of-charge analysis of a sealed lithium-ion rechargeable battery", Journal of Solid State Electrochemistry 3 (1999) 397-405],investigating the cell response in the high frequency domain, were not conclusive because the electrolyte does not participate to the overall reaction of the battery. Rather, a pronounced effect of state-of-charge was observed on those electrical quantities extracted from the low frequency region of the impedance diagrams. So, as the impedance modulus, the phase angle, the equivalent series and parallel capacitance of the cell change. However, measurements at low frequencies are time-consuming and hence less suitable for routine monitoring of cells in service.

In the case of sealed lead-acid batteries, R. T. Barton and P. J. Mitchel ["Estimation of the residual capacity of maintenance-free lead-acid batteries—Identification of a parameter for the prediction of state-of-charge", Journal of Power Sources 27 (1989) 287-295] identified the ohmic resistance as an effective parameter for the prediction of the state-of-charge using the AC impedance spectroscopy. The measurements were, however, conducted at various state-of-charge values only after allowing time for the system to stabilise.

Since the high frequency interval is much more attractive for quick estimation, this frequency domain is preferred. The only impedance parameter, which can be investigated in the high frequency domain, is the battery internal resistance.

DE 102 05 120 A1 describes a procedure and an apparatus for the estimation of the battery internal resistance. The battery is excited by the existing high frequency current fluctuations, and the resulting voltage is measured. The battery internal resistance is determined by calculation of the battery power.

DE 197 25 204 C1 describes a procedure and a device for the determination of state-of-charge of a lithium-battery for remote control application. The procedure is based on the simultaneous measurement of the cell internal resistance and the voltage at the poles.

The internal resistance parameter can be easily extracted from the impedance spectrum. It corresponds to the impedance value at the intersection point of the spectrum with the real axis. In this context, this parameter has also been used as indicator to evaluate a fuel cell's electrical efficiency in the international patent WO 02/27342 A2.

GENERAL DESCRIPTION OF THE INVENTION

The invention is based on the objective of refining a method of the generic type in such a way that a fast and reliable determination of battery state-of-charge is provided and that the exposed drawbacks of the state of the art are eliminated.

In addition, the invention is based on the objective to create a device that is suited for carrying out the method and thus also offers the mentioned advantages of a refined method.

Accordingly, the invention provides a method for determining a state-of-charge of a battery, comprising the steps of evaluating a transition frequency of an impedance for a battery, which is excited by an alternating current, and assigning the transition frequency to the state-of-charge of the battery, wherein the transition frequency is a frequency of the alternating current at which the imaginary part of the impedance of the battery vanishes.

Further, the invention provides a device for determining a state-of-charge of a battery, comprising an element for determining a transition frequency of an impedance of a battery, which is excited by an alternating current, and a calculation unit for assigning of the transition frequency to the state-of-charge of the battery, where the transition frequency is a frequency of the alternating current at which the imaginary part of the impedance of the battery vanishes.

It is particularly preferable to determine a transition frequency of an impedance of a battery excited by an alternating current signal, and the transition frequency is associated with the battery state-of-charge. The transition frequency is the frequency at which the impedance diagram crosses the real axis. Since the impedance imaginary part changes its algebraic sign at this frequency value, this parameter is hereafter labeled $f_\pm$.

The alternating current excitation is generated by an alternating current source to which the battery is connected.

The method is preferably used to monitor the state-of-charge of the battery while in service.

Therefore, the alternating current source is preferably a load in the power net, which is supplied by the battery or an alternating current source, which is not necessarily variable.

The electric power net, which is supplied by the battery, often comprises loads, which produce noise signals. These noise signals existing in the power net superimpose an alternating current signal component to the direct current delivered by the battery.

It is particularly preferable to use, as alternating current source, resistances present in the power net, which are switched at a certain frequency.

In addition, there are other alternating current sources in the power net which possibly excite the battery.

In virtue of the invention, the method can be realized as a purely passive procedure in the sense that no additional, special current source, exclusively used for the realization of the method, is required for the excitation of the battery.

It is, however, also suitable to connect the battery to an alternating current source, for the case the alternating current signals existing in the power net, whose frequency lies in the frequency range of the transition frequency, do not possess sufficiently high amplitudes.

For the determination of the transition frequency, an alternating voltage drop at the battery and the intensity of the alternating current flowing through the battery are measured.

The transition frequency, determined according to the invention, is the frequency at which the impedance curve of the battery crosses the real axis in the complex impedance diagram.

The invention makes use of the surprising discovery of a clear-cut correlation between the transition frequency and the battery state-of-charge.

The transition frequency thus corresponds to the transition frequency of a circuit composed of the battery and an alternating current source.

Nevertheless, only the features of the battery must be involved in the resonance conditions, and not the internal resistance, internal capacitance or inductance of the alternating current source. Although a precise determination of the transition frequency is very practical, other frequencies, with comparable properties, can be employed for the realization of the invention. According to the invention, the transition frequency used designates not only the frequency value at which the impedance diagram crosses the real axis but other frequencies with comparable properties as well, in particular, the resonance frequency.

The procedure is based on a clear-cut relationship between the transition frequency and the battery state-of-charge.

FIG. 3 shows the relationship between the battery state-of-charge and the transition frequency. This relationship has been demonstrated for a large domain of operating conditions.

The transition frequency can be determined in two ways:

It corresponds, on the one hand, to the frequency at which the alternating voltage and the intensity of the alternating current flowing through the battery are in-phase. On the other hand, the imaginary part of the impedance vanishes for an alternating current signal, with a frequency $f_\pm$, flowing through the battery.

For the determination of $f_\pm$, the alternating voltage drop and the intensity of the alternating current flowing through the battery are measured at different frequencies.

For this purpose, it is preferable to pre-set a frequency range, which typically includes the transition frequency. This frequency range is then discretely or continuously scanned.

It is advantageously planned to determine the phase difference between the phase of the alternating voltage and the phase of the alternating current.

The phase difference is measured for each scanned frequency till the frequency, at which the phase difference vanishes, is found.

This frequency is the transition frequency to which a state-of-charge value will be attributed by means of the relationship between the transition frequency and the state-of-charge.

The so determined state-of-charge is output for further use. For example, it might be displayed to the person who uses the battery or to a battery management system.

In a preferred implementation of the method, the complex impedance is measured as a function of the frequency of the alternating current signal.

In this case, it is practical to perform a Fourier Transformation of the voltage and current signals or to calculate directly the impedance and transform it.

It is preferable to apply a fast-Fourier Transform.

From the result of the impedance calculation, the frequency at which the impedance imaginary part vanishes is determined.

This is the transition frequency $f_\pm$ to which the actual state-of-charge is associated, using the $f_\pm$-state-of-charge correlation.

In addition, the relationship between the transition frequency and the state-of-charge is influenced by the operating temperature and by the direct current flowing through the battery.

In an advantageous implementation of the method according to the invention, the operating temperature and the flowing direct current are measured and taken into consideration in the relationship between the transition frequency and the state-of-charge.

In addition, the relationship between the transition frequency and the state-of-charge is influenced to some extent by the aging status of the battery.

The accuracy of the determination of the state-of-charge can thus be further improved if the aging status of the battery is taken into account in the relationship between the transition frequency and the state-of-charge.

It is also possible to evaluate the aging status of the battery from the transition frequency.

Another aspect of the invention is the design of a device suited for carrying out the method.

In terms of the device, the objective of the invention is achieved by a device according to the preamble of claim 14 comprising a means for the determination of the transition frequency of the alternating current signal exciting the battery and a means for the assignment of the transition frequency to the state-of-charge.

The means for the determination of the transition frequency measures and compiles the alternating voltage of the battery and the intensity of the alternating current signal flowing through the battery.

It is preferable that the means for the determination of the transition frequency comprises further means for the determination of the phase and the amplitude both of the voltage and the current and for the determination of the impedance of the battery.

Additional advantages, special features and practical refinements of the invention ensue from the subordinate claims and from the presentation below of preferred embodiments making reference to the drawings.

BRIEF DESCRIPTION OF THE DRAWINGS

The drawings depict

DETAILED DESCRIPTION

Figure 1:
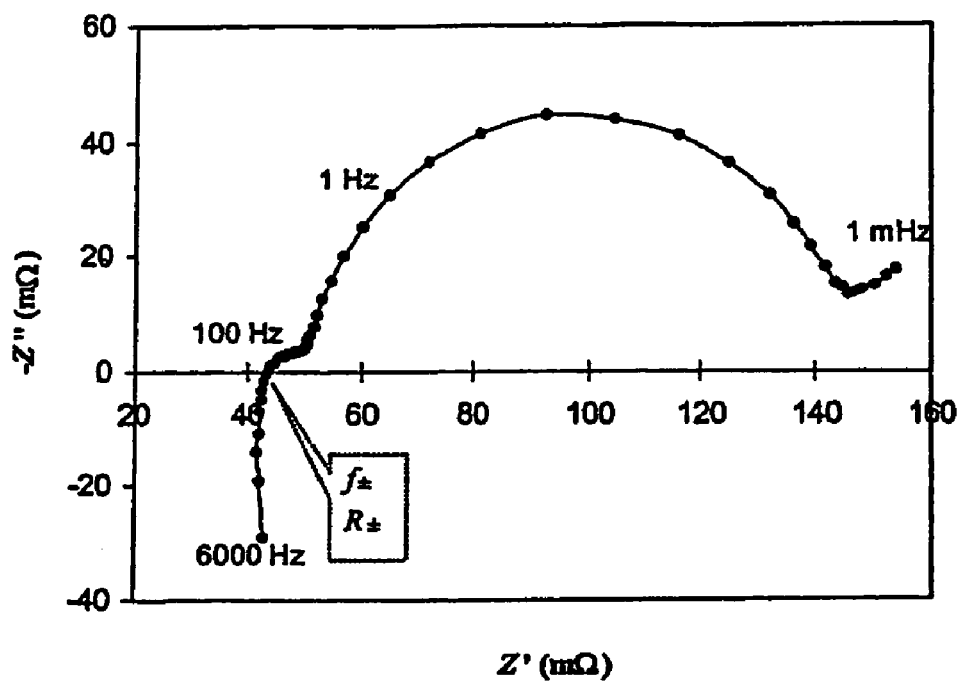
FIG. 1: Typical impedance diagram of a commercial battery at an intermediate state-of-charge.

FIG. 1 displays a typical impedance diagram plotted on a commercial battery in the $6000$-$10^{-3}$ Hz frequency range, in the complex plane. In this presentation, the negative imaginary part of the impedance is plotted versus its real part for the considered frequencies. The imaginary part is usually designated $Z''$, and the real part, $Z'$.

In this and in the following figures, the measured values are presented by dots; the solid curve corresponds to the regression curve of the measured data.

A significant inductive behavior is observed at frequencies higher than ca. 100 Hz. This corresponds to the region where $-Z'' < 0$.

This behavior is considered to be related both with the geometry of the cell and the porosity of the plates.

The intersection of the diagram with the real axis is denoted $R_\pm$. It corresponds to the sum of internal resistances of the battery stemming from the ohmic resistance of the electrolyte, the grids and the current collectors.

As mentioned at the beginning, the $R_\pm$ parameter can be used for the determination of the battery state-of-charge in the case of lead-acid batteries, since the decrease of the concentration of the sulfuric acid electrolyte, during battery discharge, modifies the ohmic internal resistance.

The capacitive behavior of the battery at lower frequencies (region where $-Z'' > 0$) describes the response of the different electrochemical steps involved in the electrode processes.

Examination of to which extent parameters from the respective domains may be employed for the state-of-charge determination as well as their limitations is exposed at the beginning.

In the research studies devoted to assess the potential validity of this invention, the transition frequency $f_\pm$ of batteries has been examined. This corresponds to the frequency at which the impedance imaginary part vanishes and presents thereby the frequency corresponding to the $R_\pm$ value.

Figure 2:
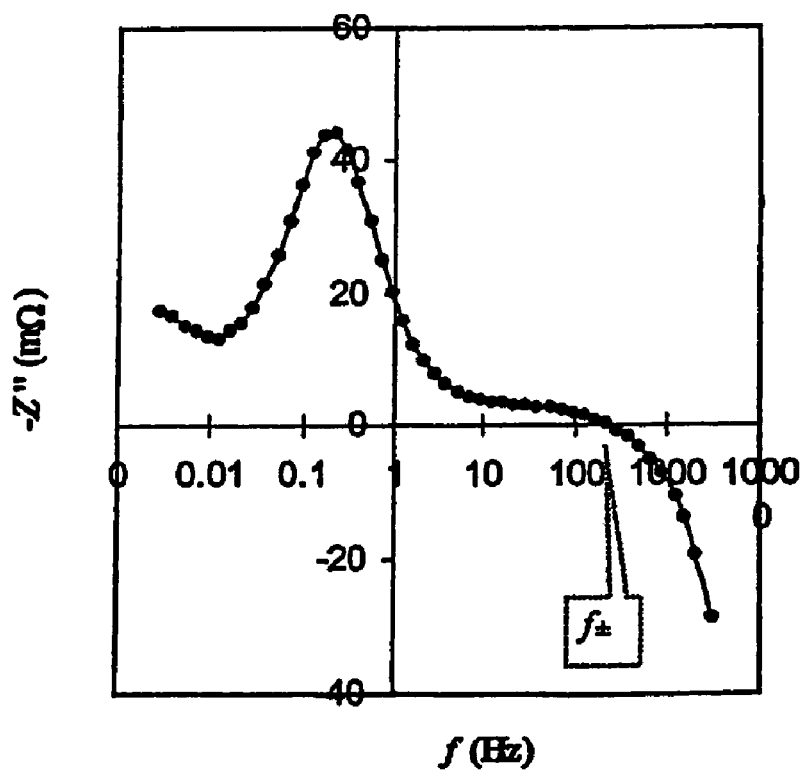
FIG. 2: Variations of the impedance imaginary part as a function of the frequency.

The dependence of the impedance imaginary part on the frequency of the alternating voltage drop at the battery is presented graphically in FIG. 2.

An advantage of the invention is that the transition frequency $f_\pm$ can be easily determined by interpolation of the curve shown in FIG. 2 to the point with $-Z''=0$.

As is further described, the transition frequency is an easy-to-determine-parameter.

It is also characterized by the transition from the inductive to the capacitive behavior of the battery.

It has been established in the experiments carried out, that the dependence of $f_\pm$ on the battery state-of-charge is monotonous.

Figure 3:
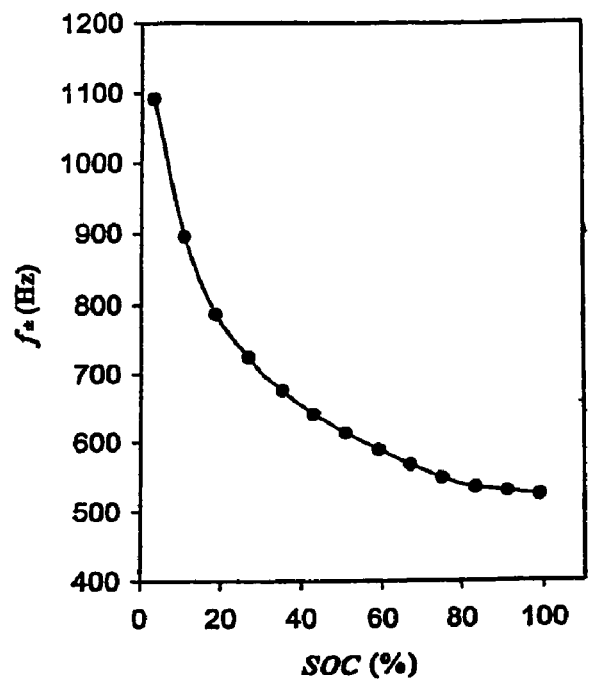
FIG. 3: Correlation between the transition frequency and the battery state-of-charge for a 70 Ah-lead-acid battery during discharge at a temperature of $-18°$ C.

FIG. 3 shows the dependence of the frequency $f_\pm$ on the state-of-charge of a lead-acid battery. The battery state-of-charge is labeled SOC and is given in %. The percent value refers to the ratio between the available capacity in the battery and the nominal capacity. This ratio usually defines the battery state-of-charge.

The nominal capacity of the investigated lead-acid battery was 70 Ah and the results exposed in FIG. 3 correspond to a discharge at −18° C.

For a decrease of SOC from 100 to 0%, the $f_\pm$ parameter varied with ca. 600 Hz.

For a complete discharge at room temperature, the variation of the transition frequency amounted to 3000 Hz.

The variations of $f_\pm$ with the state-of-charge are so large, that they allow a precise determination of the battery capacity.

Consequently, the $f_\pm$ parameter can serve as a reliable, precise tool for the indication of the battery state-of-charge.

The correlation between $f_\pm$ and the battery state-of-charge has been examined on numerous types of batteries and in different operating conditions. The results, illustrated here as an example for the special case of the discharge of a lead-acid battery, have been qualitatively demonstrated by these tests.

Typically, thorough investigations have been conducted on Ni—Cd batteries, Ni-MH batteries and valve-regulated gel-lead-acid batteries.

The measurements have been carried out immediately after intermittent charges and discharges, during battery charge and discharge and at temperatures ranging from −18 up to 50° C.

All measurements produced a reproducible correlation between the transition frequency and the state-of-charge of the battery. Only a small hysteresis effect on the transition frequency curve was detected.

The method according to the invention is based on the fact that the behavior of the battery changes from inductive to capacitive at the transition frequency, and therefore, at the transition frequency, all properties and processes of the battery have an influence on the impedance parameters.

Thus, the method according to the invention may in principle be used for the detection of the state-of-charge of all batteries that show sufficient inductive behavior.

This especially implies that the Nyquist diagram of the impedance of the batteries, in the complex plane, has a branch in the region of negative values of −Z".

This is typical property of all batteries with a nominal capacity of at least 1 Ah.

The method according to the invention may in principle be applied to primary cells, too.

Figure 4:
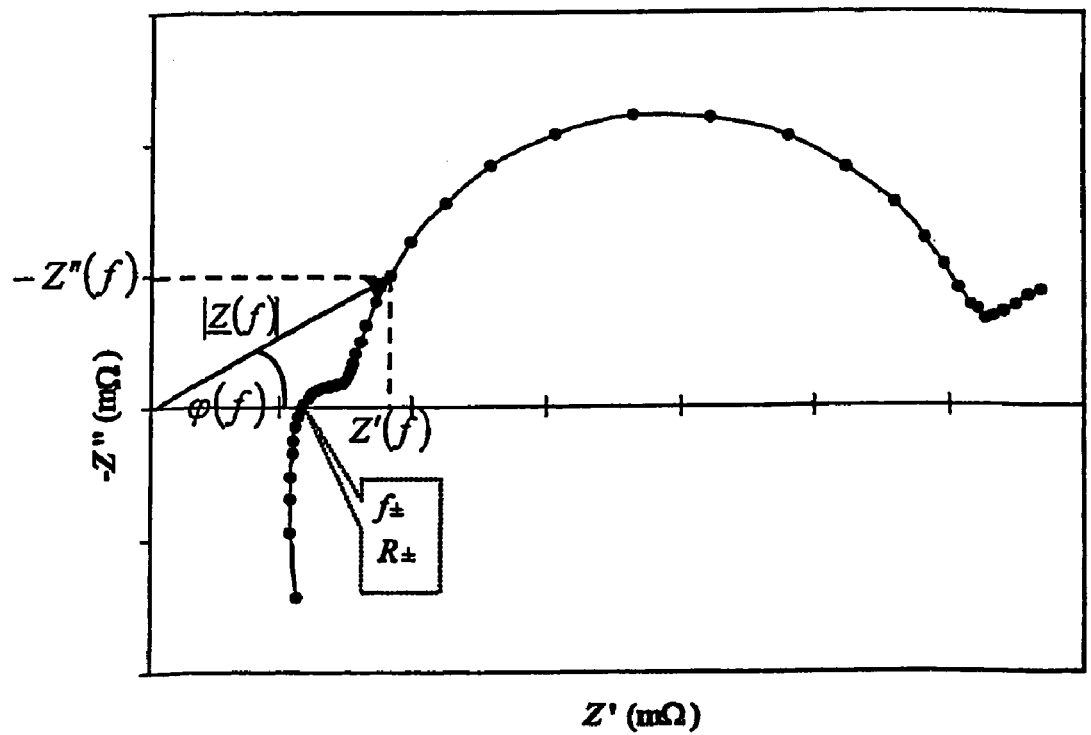
FIG. 4: Illustration of the impedance parameters in the form of a diagram in the complex plane.

FIG. 4 shows a graphical representation of the parameters related to the impedance in the complex plane.

The impedance at each frequency f may either be described in polar coordinates by the modulus $|\underline{Z}(f)|$ and the phase angle $\phi(f)$ or in Cartesian coordinates by the real part Z'(f) and the negative imaginary part −Z"(f).

The transition frequency $f_\pm$ of a series resonant circuit has the characteristic property that the current through the battery and the voltage at the battery are in-phase, which is equivalent to $\phi(f_\pm)=0$.

As shown in FIG. 4, it is equivalent to describe the transition frequency with the condition $Z''(f_\pm)=0$.

Each of the two given equations shows a method for determining $f_\pm$.

Within this invention, both methods are used.

Figure 5:
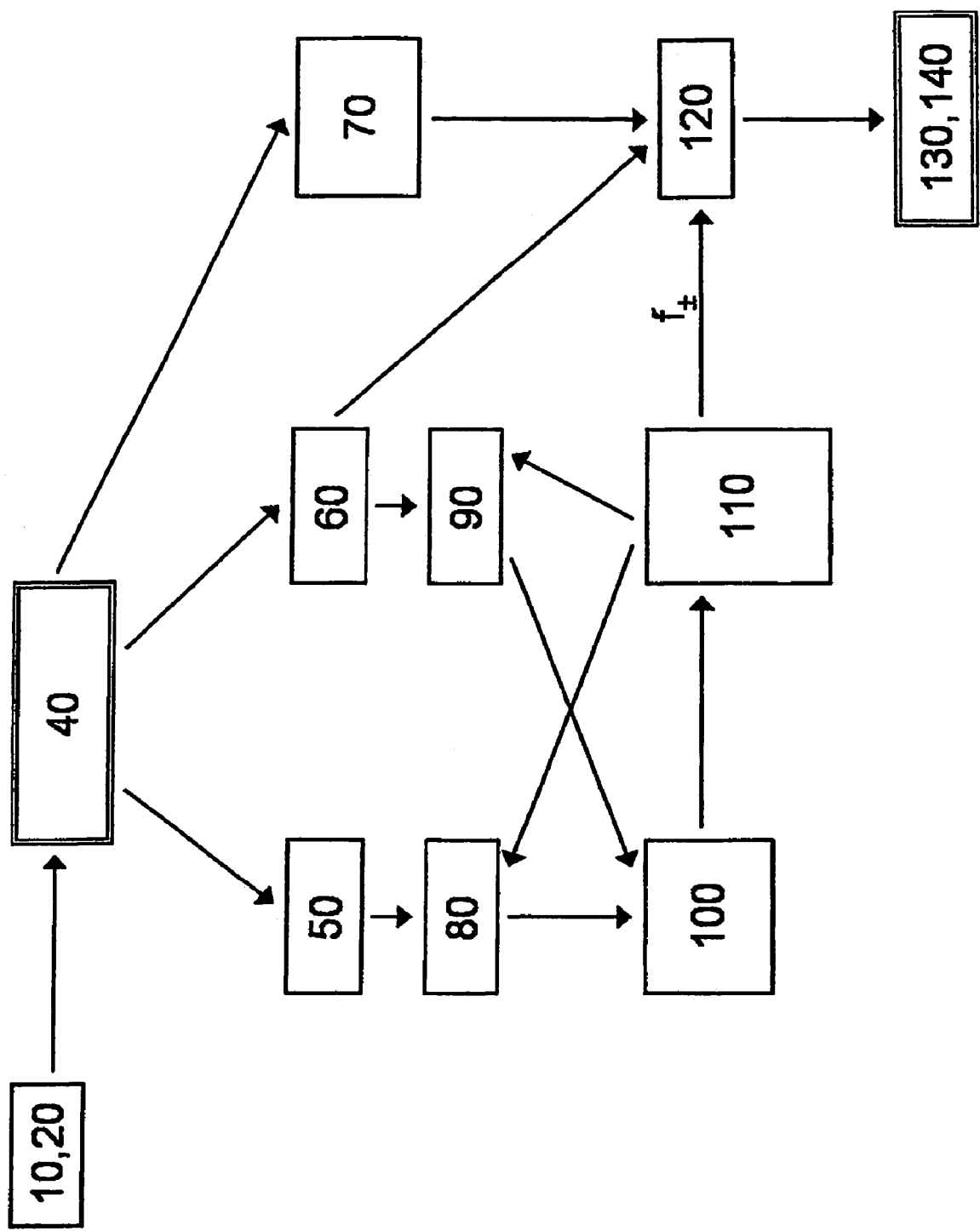
FIG. 5: A block diagram of an embodiment of a device for the determination of battery state-of-charge with phase-comparator, without variable alternating current signal source.

FIG. 5 shows a block diagram of a device for determining the state-of-charge of a battery (40).

The device is connected to a battery (40), which is excited by noise signals that exist in the power net connected to the battery (40). These noise signals are alternating current signals that are caused by existing loads (10) or current sources (20).

The device comprises a sensor (50) for acquisition of the alternating voltage of the battery (40).

It also comprises a sensor (60) to acquire the alternating current flowing through the battery (40).

In general, the noise signals include signals at various frequencies.

The voltage and the current signals are processed by a band-pass filter (80, 90), which may only be passed by a harmonic part of the signal that has a frequency lying within a small frequency band.

It is preferred that the middle frequency of the frequency band may be adjusted and changed in order to scan the relevant frequency range.

The device also comprises a phase comparator (100), which detects the phases of the components of the voltage and the current signals that have passed the band-pass filters (80, 90) and determines the phase difference $\phi(f)$ between the components of the signal at the frequency f that was set for the band-pass filters (80, 90).

The value of this phase difference is forwarded to a control unit (110), which controls the resonant frequency of the band-pass filters (80, 90) in dependence on the value of the phase difference.

Preferably, this is done, by adjusting the resonant frequency of the band-pass filter (80, 90), until it coincides with the frequency $f_\pm$ at which the phase difference $\phi(f)$ detected by the phase comparator (100) vanishes.

The frequency $f_\pm$, which corresponds to the transition frequency, is forwarded to the calculation unit (120).

The device also contains a sensor (70) that acquires the operating temperature of the battery (40) and sends it to the calculation unit (120).

The sensor (60) for the measurement of the intensity of the alternating current flowing through the battery (40) also includes a means to measure the intensity of the direct current flowing through the battery (40). This value is forwarded to the calculation unit (120).

For various types of batteries, various operating temperatures and other operating conditions, the correlation between the transition frequencies and the state-of-charge of the battery (40) is stored in the calculation unit (120) in form of functions or tables.

The other operating conditions include the intensity of the direct current flowing through the battery (40) and the information, that the battery is currently being charged or discharged.

Preferably, the calculation unit (120) has the ability to determine from the value of the current that the battery (40) is currently being charged or discharged.

The functions and tables for this correlation are determined by separate measurements or implemented in the form of calculation or correlation rules within the calculation unit (120).

The measurements for identification of the correlation rules may for example be determined during various operating cycles by means of procedures known from the state of the art.

The calculation unit (120) determines the state-of-charge of the battery (40) using these rules and the information forwarded to it regarding the transition frequency, the temperature and further operating parameters of the battery (40).

Preferably, the state-of-charge is output by the calculation unit and may be forwarded to a display unit (130) and/or to a system for the monitoring of battery parameters (140).

The implementation of the invention as shown in FIG. 5 may be most favorably used if the existing loads (10) and current sources (20) in the power net provide alternating current signals with sufficient amplitudes in the relevant frequency range.

Resistors are connected and disconnected at a known frequency to typical power nets, into which the device may be integrated.

Switching of these resistors is often carried out by a control unit that controls the switching frequency and additionally, if need be, measures the current intensity.

Therefore, as a modification of the implementation shown in FIG. 5, it is possible to use the value of the current that is recorded by the existing control units and forward it to the phase comparator (100).

Figure 6:
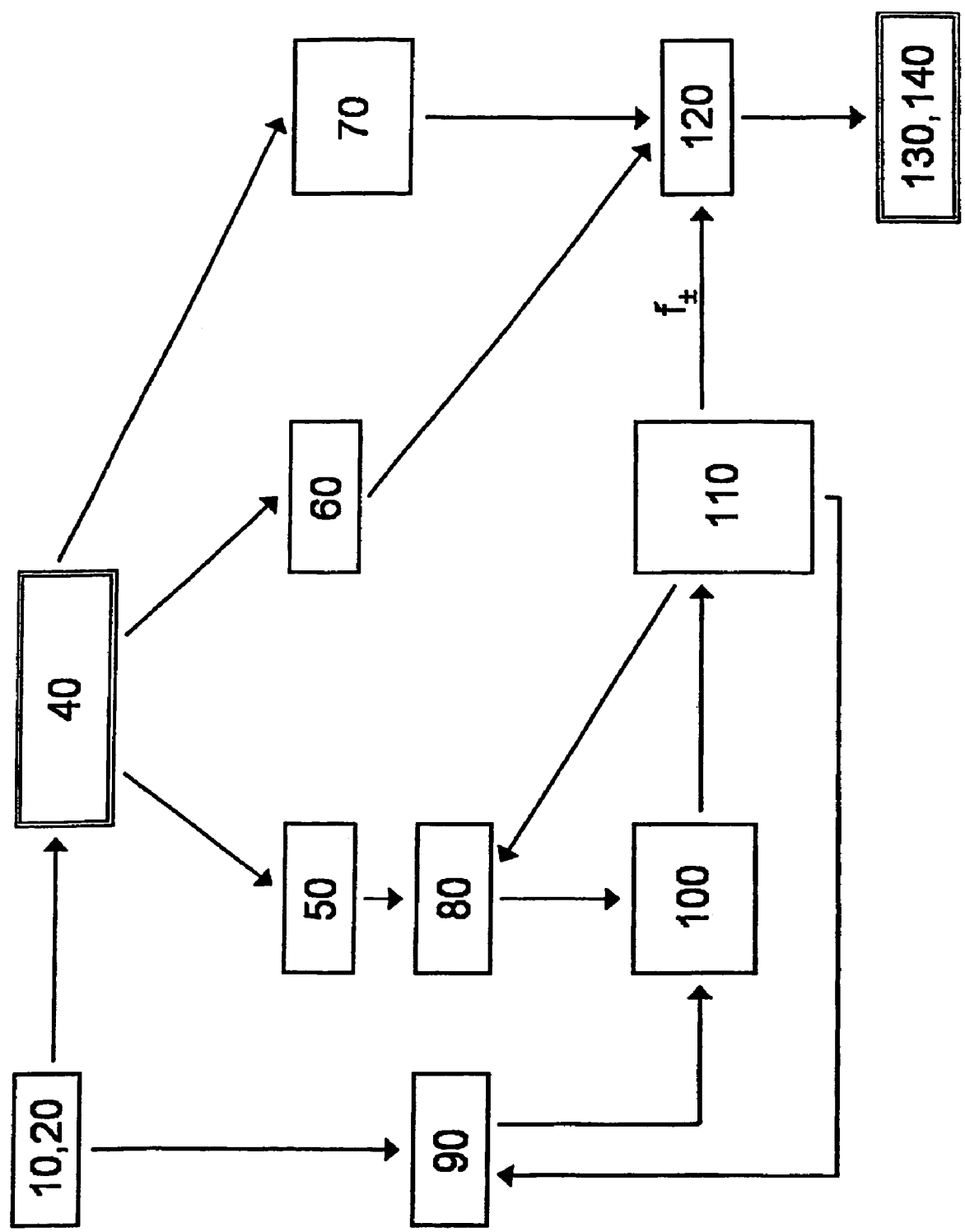
FIG. 6: A block diagram of another embodiment of a device for the determination of battery state-of-charge with phase-comparator, without variable alternating current signal source.

This embodiment is shown in FIG. 6.

Typically, the current signal contains a superposition of harmonic alternating current signals with various frequencies, so that it needs to be filtered by an adjustable band-pass filter (90) that in turn is controlled by a control unit (110).

Figure 7:
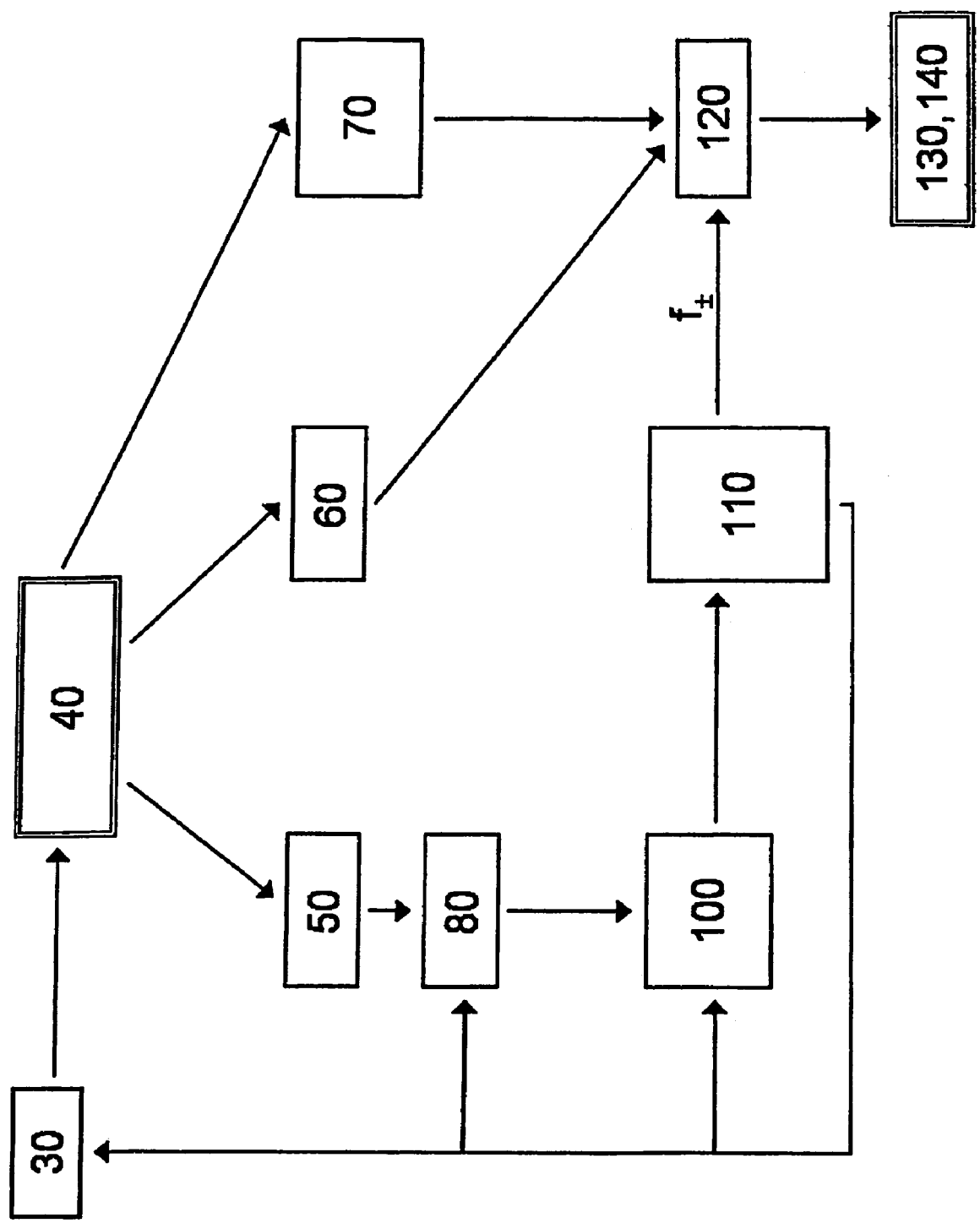
FIG. 7: A block diagram of a device for the determination of battery state-of-charge with phase-comparator, and with variable alternating current signal source.

FIG. 7 shows a block diagram of a device for determining the state-of-charge of a battery (40) with a phase comparator (100) and a variable alternating current source (30).

This embodiment of the device according to the invention may be beneficial for determining the state-of-charge of a battery (40) that is not excited by noise signals.

The use of a device according to this embodiment is envisaged for the case that the loads and current sources present in the power net do not provide signals with sufficient amplitude in the relevant frequency range.

The embodiment presented in FIG. 7 differs from that shown in FIG. 5 at first in that it does not include a band-pass filter (90) for the current signal featured by sensor (60).

Instead, as described in relation with FIG. 5, the alternating current signal detected by sensor (50) is forwarded via the band-pass filter (80) to the phase comparator (100).

In this embodiment, the battery is connected to an additional variable current source (30) that generates an alternating current with a known frequency and phase to excite the battery (40).

The frequency and phase of the alternating current flowing through the battery (40) may therefore be sent directly from the current source (30) to the phase comparator (100).

An additional measuring is not required. However, it may be provided.

The voltage signal of the AC voltage of the battery is in turn detected by an appropriate sensor (50) and processed by a band-pass filter (80).

The phase difference between the current and the voltage signals determined by the phase comparator (100) is in turn forwarded to the control unit (110).

This unit controls the frequency of the alternating current provided by the variable current source (30) and the resonant frequency of the band-pass filter (80) depending on the value of the phase difference.

Preferably, the resonant frequency of the band-pass filter is adjusted until it coincides with the frequency $f_\pm$ at which the determined phase difference $\phi$ ($f_\pm$) vanishes.

The band-pass filter (80) is controlled so that the average resonant frequency coincides with the frequency set by the current source (30).

When the transition frequency is determined from the null phase difference, the calculation unit (120) determines the battery state-of-charge from the value of the frequency $f_\pm$ delivered to it, as is presented by FIG. 5.

As explained, the transition frequency can also be determined from the dependence of the impedance imaginary part.

Figure 8:
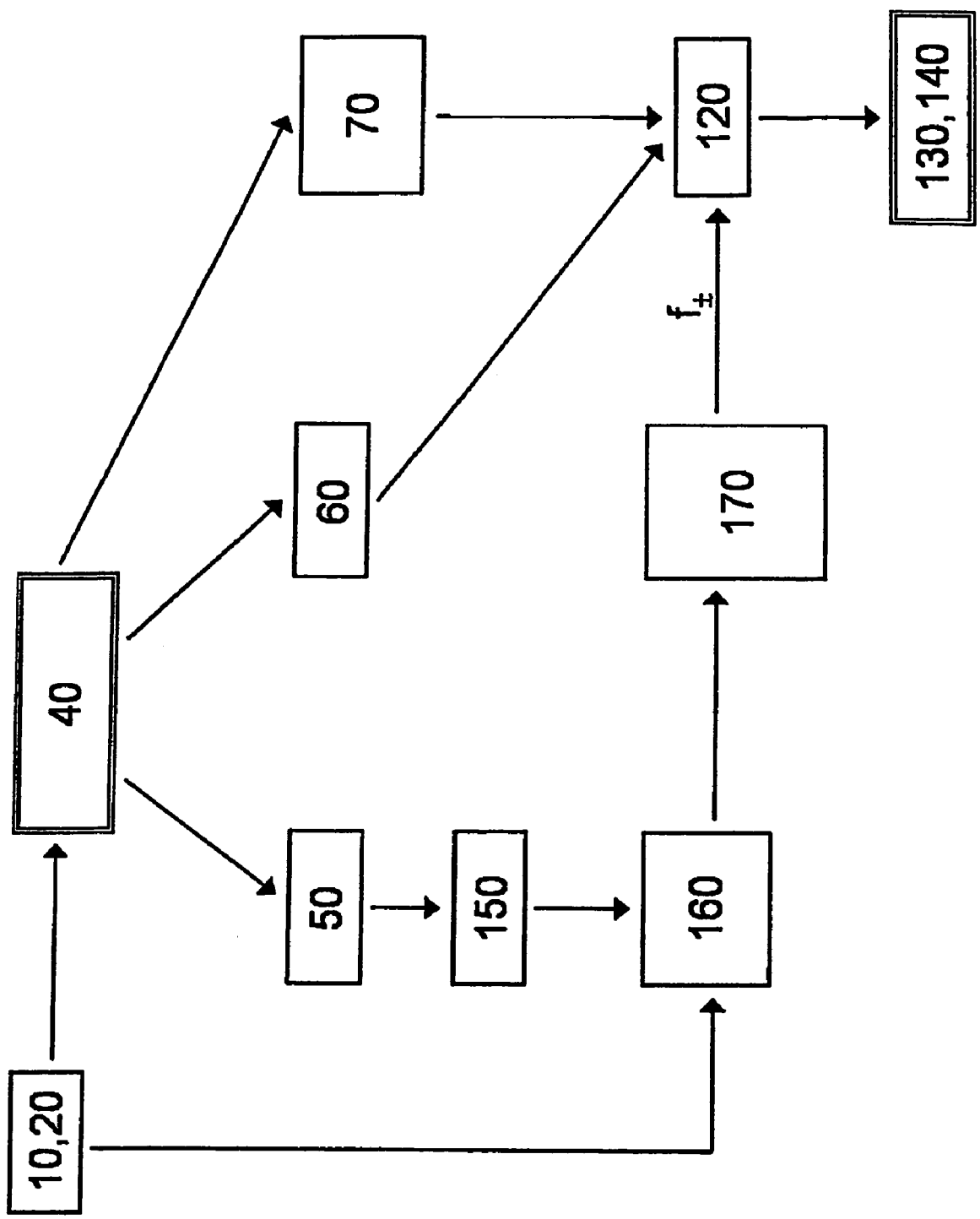
FIG. 8: A block diagram for an impedance-based device for the determination of battery state-of-charge, without variable current signal source.

A device without variable current source, on which this preferred method is based, is presented in FIG. 8 in the form of a block diagram.

The device is connected to a battery (40), which is excited by noise signals present in the power net supplied by the battery (40). These noise signals are alternating current generated by the existing loads (10) or current sources (20).

This form of design is preferably applied for the state-of-charge determination, in case the loads (10) and current sources (20) existing in the power net provide alternating current signals with sufficient amplitude in the relevant frequency domain.

The amplitudes, the frequencies and the phases of these noise signals can be in numerous cases evaluated at the loads (10) or the current sources (20) themselves, as is explained in FIG. 6.

The control units of the loads (10) and the current sources (20) can be designed so that they transfer the current signals to the device.

The device comprises a sensor (50) to measure the alternating voltage drop at the battery (40).

The voltage signal is processed in a low-pass filter (150), which can be crossed only by the portion of signals having a frequency in the relevant frequency domain.

The proportion of the voltage signals, which passes through the low-pass filter, is transmitted to a means (160) for Fourier transformation, along with the information on the amplitude, the frequency and the phasing of the current generated by the loads (10) or the sources (20).

All information for the determination of the signal transformation are available to the means (160).

The means (160) for the Fourier Transformation determines the impedance and performs a Fourier Transformation of the impedance or evaluates the Transform of the impedance from the transformed current and voltage signals.

It is preferable to perform a fast Fourier Transformation.

After performing the Transformation, a signal, which contains the Fourier-transformed impedance, is communicated to a calculation unit (170), which determines the frequency $f_\pm$, at which the impedance imaginary part vanishes.

The frequency $f_\pm$ at which $-Z''(f_\pm)=0$ is the transition frequency of the battery (40).

In case the impedance imaginary part is not exactly zero at none of the frequencies, it is possible to interpolate between two frequency values.

It is preferable to choose two frequencies, the impedance imaginary part of one frequency of which is slightly above zero and the impedance imaginary part the second frequency of which is slightly below zero. Both impedance imaginary parts are linearly linked. The null position of this segment corresponds to the transition frequency $f_\pm$.

The transition frequency, the direct current flowing through the battery (40) and the operating temperature are provided to the calculation unit (120).

The device disposes of sensors (60, 70), which measure the direct current flowing through the battery (40) and the operating temperature of the battery (40).

The calculation unit (120) determines the state-of-charge of the battery (40) in turn, as is depicted by FIG. 5.

Figure 9:
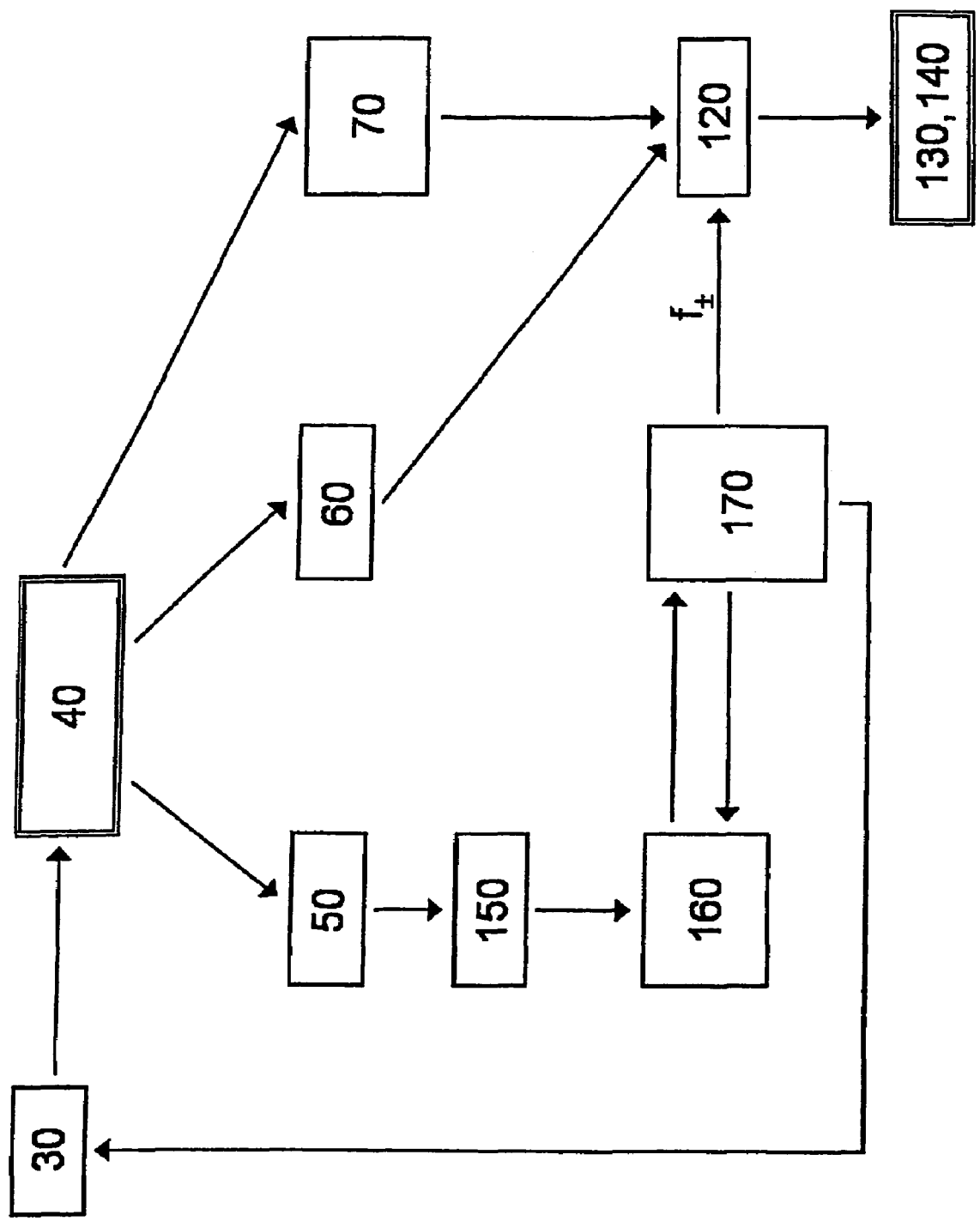
FIG. 9: A block diagram for an impedance-based device for the determination of battery state-of-charge, with variable current signal source.

The embodiment of a device based on this invention, shown in FIG. 9, is applied in case the battery (40) is not integrated to the power net or in case the noise signals present in the power net do not have sufficiently high amplitudes in the relevant frequency domain.

It differs from the embodiment presented in FIG. 8 by the fact that the battery (40) is connected to a variable current source (30), which is controlled by the analysis unit (170).

The frequency of the current source is modified by the analysis unit (170) until the frequency, where the impedance imaginary part of battery (40) is zero, is found.

The frequency and the phase of the alternating current delivered by the source (30) are controlled by the analysis unit (110) and the information about the frequency, the phase and the amplitude of the voltage and the current are transferred to the means (160) for performing the Fourier-Transformation, and accordingly partially evaluated.

Apart from these differences, the device in FIG. 9 disposes of the same components like the device in FIG. 8 and operates in the same way.

In addition to the embodiments presented so far, embodiments of the invention, which comprise means for the acquisition and the determination of further estimable parameters from the impedance spectrum are provided.

Thus, the determination of the battery state-of-charge by means of the method according to the invention can be completed by further methods for the determination of battery state-of-charge in order to improve the accuracy and reliability.

It is in particular profitable, in the scope of the device based on this invention, to measure the amplitudes of the battery alternating voltage and of the current flowing through the battery at the transition frequency $f_\pm$.

From the ratio of these amplitudes, the parameter $R_\pm$ can be calculated and used for an additional determination of the state-of-charge. This can be carried out by the control unit (110) or the analysis unit (170).

Furthermore, the value of $R_\pm$ informs about the aging mechanisms going on in the battery.

The transition frequency $f_\pm$ depends to some extent on the aging status of the battery.

In order to undertake a much precise determination of the state-of-charge, it can be intended to take the aging status of the battery into consideration in the relationship between the transition frequency and the state-of-charge.

Likewise, it is possible to estimate the aging status of the battery.

LIST OF REFERENCE SYMBOLS

Z' Real part of the complex impedance
Z" Imaginary part of the complex impedance
$f_\pm$ Transition frequency of the battery
$R_\pm$ Real part of the impedance where the imaginary part is null
f Frequency of the alternating current flowing through the battery
SOC State-of-charge of the battery
Z Impedance
φ Argument of the impedance
10 Load
20 Current source
30 Variable current source
40 Battery
50 Sensor for the measurement of the voltage drop at the battery
60 Sensor for the measurement of the current flowing through the battery
70 Sensor for the measurement of the operating temperature of the battery
80 Band-pass filter
90 Band-pass filter
100 Phase comparator
110 Control unit
120 Calculation unit
130 Display device
140 Battery management system
150 Low-pass filter
160 Means for the Fourier Transformation
170 Analysis unit

The invention claimed is:

1. A method for determining a state-of-charge of a battery, comprising the steps of
evaluating a transition frequency of an impedance for a battery, which is excited by an alternating current, and assigning the transition frequency to the state-of-charge of the battery wherein the transition frequency is a frequency of the alternating current at which the imaginary part of the impedance of the battery vanishes.

2. The method according to claim 1, comprising exciting the battery by noise signals which are generated by loads in a power net which comprises the battery, and/or by an alternating current source contained in the power net.

3. The method according to claim 1 comprising measuring the alternating voltage drop at the battery.

4. The method according to claim 1, comprising measuring the intensity of the alternating current flowing through the battery.

5. The method according to claim 1, comprising determining a phase difference between a phase of an alternating voltage and a phase of the alternating current.

6. The method according to claim 1, comprising determining the transition frequency of the alternating current, at which the phase difference between the phase of an alternating voltage and the phase of the alternating current vanishes.

7. The method according to claim 1, comprising determining the complex impedance of the battery.

8. The method according to claim 1, comprising determining the frequency of the alternating current, at which an imaginary part of the impedance vanishes.

9. The method according to claim 1, comprising varying a frequency of the alternating current, exciting the battery.

10. The method according to claim 1, wherein the assignment of the transition frequency to the state-of-charge is a function of the operating temperature of the battery.

11. The method according to claim 1, wherein the assignment of the transition frequency to the state-of-charge is a function of an intensity of a direct current flowing through the battery.

12. The method according to claim 1, wherein the assignment of the transition frequency to the state-of-charge is a function of the aging status of the battery.

13. The method according to claim 1, comprising determining an aging status of the battery.

14. A device for determining a state-of-charge of a battery, comprising an element for determining a transition frequency of an impedance of a battery, which is excited by an alternating current, and a calculation unit for assigning the transition frequency to the state-of-charge of the battery, where the transition frequency is a frequency of the alternating current at which the imaginary part of the impedance of the battery vanishes.

15. The device according to claim 14, comprising a variable alternating current source.

16. The device according to claim 14, wherein the element for determining of the transition frequency comprises a sensor for the measurement of an alternating voltage drop at the battery.

17. The device according to claim 14, wherein the element for determining of the transition frequency comprises a sensor for the measurement of the intensity of an alternating current flowing through the battery.

18. The device according to claim 14, wherein the element for determining of the transition frequency comprises at least a variable frequency filter for filtering the measured current and voltage signals.

19. The device according to claim 14, wherein the element for determining of the transition frequency comprises a phase comparator, which determines the phase difference between the filtered current and voltage signals.

20. The device according to claim 14, wherein the element for determining of the transition frequency comprises a control unit, which scrutinizes the phase difference and modifies a transmitted frequency of the frequency filter and/or a frequency of the alternating current source, till the phase difference is null.

21. The device according to claim 14, wherein the element for determining the transition frequency comprises a unit for the Fourier Transformation of the measured current and voltage signals.

22. The device according to claim 14, wherein the element for determining of the transition frequency comprises an analysis unit for analyzing the transformed signals and determining a frequency for which an imaginary part of an impedance of the battery vanishes.

23. The device according to claim 14, comprising a sensor for measuring an operating temperature of the battery.

24. The device according to claim 14, comprising a sensor for measuring the intensity of a direct current flowing through the battery.

25. The device according to claim 14, wherein the calculation unit comprises calculation specifications for assigning the transition frequency to the state-of-charge of the battery for several operating temperatures of the battery.

26. The device according to claim 14, wherein the calculation unit comprises calculation specifications for assigning the transition frequency to the state-of-charge of the battery for several intensities of the direct current flowing through the battery.

27. The device according to claim 14, wherein the calculation unit comprises calculation specifications for assigning the transition frequency to the state-of-charge of the battery for several aging statuses of the battery.

28. The device according to claim 14, comprising a display device for displaying the state-of-charge of the battery.

* * * * *

UNITED STATES PATENT AND TRADEMARK OFFICE
CERTIFICATE OF CORRECTION

PATENT NO. : 7,541,814 B2
APPLICATION NO. : 10/573510
DATED : June 2, 2009
INVENTOR(S) : Rik W. De Doncker et al.

It is certified that error appears in the above-identified patent and that said Letters Patent is hereby corrected as shown below:

On the Cover Page:

Item (73) Assignee, "Rheinishe Landschaftspflege Jakob Voets INg. Grad. GmbH & Co. KG, Erkelenz" should be -- Reinisch-Westfaelisch-Technische Hochschule, Templergraben, Aachen --.

Item (30), "103 45 057" should be -- 103 45 057.2 --.

Signed and Sealed this
Thirty-first Day of January, 2012

David J. Kappos
*Director of the United States Patent and Trademark Office*